United States Patent [19]
Wang

[11] Patent Number: 5,983,491
[45] Date of Patent: Nov. 16, 1999

US005983491A

[54] I/O CARD AND METHOD MAKING THE SAME

[75] Inventor: Kuo-Cheng Wang, Tu-Cheng, Taiwan

[73] Assignee: Hon Hai Precision Ind. Co., Ltd., Taipei Hsien, Taiwan

[21] Appl. No.: 09/006,559

[22] Filed: Jan. 13, 1998

Related U.S. Application Data

[62] Division of application No. 08/561,745, Nov. 22, 1995, Pat. No. 5,771,156.

[51] Int. Cl.⁶ ..................................................... H01R 9/00
[52] U.S. Cl. .............................. 29/842; 29/830; 29/832; 29/843
[58] Field of Search .............................. 29/842, 830, 832, 29/843; 439/59, 79

[56] References Cited

U.S. PATENT DOCUMENTS

| | | |
|---|---|---|
| 5,219,377 | 6/1993 | Poradish . |
| 5,242,310 | 9/1993 | Leung . |
| 5,244,397 | 9/1993 | Anhalt . |
| 5,277,596 | 1/1994 | Dixon . |
| 5,313,364 | 5/1994 | Omori et al. . |
| 5,413,490 | 5/1995 | Tan et al. . |
| 5,666,721 | 9/1997 | Sakemi . |

*Primary Examiner*—Carl J. Arbes

[57] ABSTRACT

An I/O card assembly (10) includes a rectangular frame (12) having an internal PC board (100) therein and sandwiched between a pair of metal covers (11, 14). A pair of connectors (22, 24) are respectively positioned on two opposite ends of the I/O card assembly (10) wherein one connector (22) has contact tails solderably mounted onto the circuit pads (102) on one end of the PC board (100), and the other connector (24) has contact tails solderably mounted onto the circuit pads on the other end of the PC board (100). The frame (12) includes recesses (13) to retainably receive the mounting ears (32) of the connectors (22) therein so that the connector (22) can be retained within the frame (12) in position. The PC board (100) is made from a raw plate (106) which includes holes (104) therein to receivably retain boardlock means (34) therein so that the connector (22) can be directly but temporarily retained, i.e., not permanently fixed, with regard to the PC board (100) before the contact tails (30) have been permanently soldered onto the corresponding circuit pads (102) of the PC board (100). Therefore, such temporary retention between the connector (22) and the PC board (100) may preclude the connector (22) from misplacement with regard to the PC board (100) by any inadvertent impact before soldering, and assure the reliable and correct mountable connection or engagement between the connector (22) and the PC board (100) in a later reflow soldering process.

9 Claims, 6 Drawing Sheets

I/O CARD AND METHOD MAKING THE SAME

This application is a divisional application of U.S. patent application Ser. No. 08/561,745, now U.S. Pat. No. 5,771,156 filed on Nov. 2, 1995.

BACKGROUND OF THE INVENTION

1. Field of the Invention

The invention relates to I/O cards, and particularly to components of such I/O cards having mechanism for temporarily retaining with each other so that such I/O cards can be reliably and automatically assembled.

2. The Prior Art

I/O cards are popularly used in the computer field. The traditional I/O cards may be referred to U.S. Pat. Nos. 5,242,310, 5,244,397, 5,313,364 and 5,413,490. As well known, the traditional I/O card includes an insulative frame sandwiched by two metal covers and having an internal PC therein wherein a 68 pins connector and at least one I/O connector are respectively positioned at two opposite ends of such I/O card, and mechanically and electrically connected to such internal PC board. Recently to lower the labor cost and save time, most I/O card manufacturers intend to have assembling of I/O cards done by a full reliable automation procedure. Most prior art I/O cards include the assembling steps having the internal PC board first mounted within the frame of the I/O card, and then the I/O connector and the 68 pins connector retained to the frame wherein the SMT (Surface Mount Technology) contact tails of such two connectors are properly pressed on and engaged with the circuit pads printed on the PC board. Consequently, the contact tails of the connectors are soldered onto the corresponding circuit pads on the PC board through a reflow process, thus completing the connection between the contact tails and the PC board. Anyhow, one disadvantage of this assembling is that the connectors lack the direct retention device with the PC board before their contact tails are permanently soldered onto the circuit pads. Understandably, any inadvertent impact imposed on such unassembled or un-soldered parts of the I/O card, may have the contact tails of the connectors misplaced with regard to the PC board in either lateral or vertical direction, and thus resulting in incorrect soldering between the contact tails of and the corresponding circuit pads.

Therefore, an object of the invention is to provide an I/O card having retention mechanism for directly and also temporarily retaining the connectors in the right position with the internal PC board, thus assuring the successive proper and correct connection between the contact tails of the connector and the corresponding circuit pads of the PC board in a later reflow soldering process.

SUMMARY OF THE INVENTION

According to an aspect of the invention, an I/O card assembly includes a rectangular frame having an internal PC board therein and sandwiched between a pair of metal covers. A pair of connectors are respectively positioned on two opposite ends of the I/O card assembly wherein one connector has contact tails solderably mounted onto the circuit pads on one end of the PC board, and the other connector has contact tails solderably mounted onto the circuit pads on the other end of the PC board. The frame includes recesses to retainably receive the mounting ears of the connector therein so that the connector can be retained within the frame in position. The PC board is made from a raw plate which includes holes therein to receivably retain boardlock means therein so that the connector can be directly but temporarily retained, i.e., not permanently fixed, with regard to the PC board before the contact tails have been permanently soldered onto the corresponding circuit pads of the PC board. Therefore, such temporary retention between the connector and the PC board may preclude the connector from misplacement with regard to the PC board by any inadvertent impact before soldering, and assure the reliable and correct mountable connection or engagement between the connector and the PC board in a later reflow soldering process.

DETAILED DESCRIPTION OF THE PREFERRED EMBODIMENT

References will now be made in detail to the preferred embodiments of the invention. While the present invention has been described with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
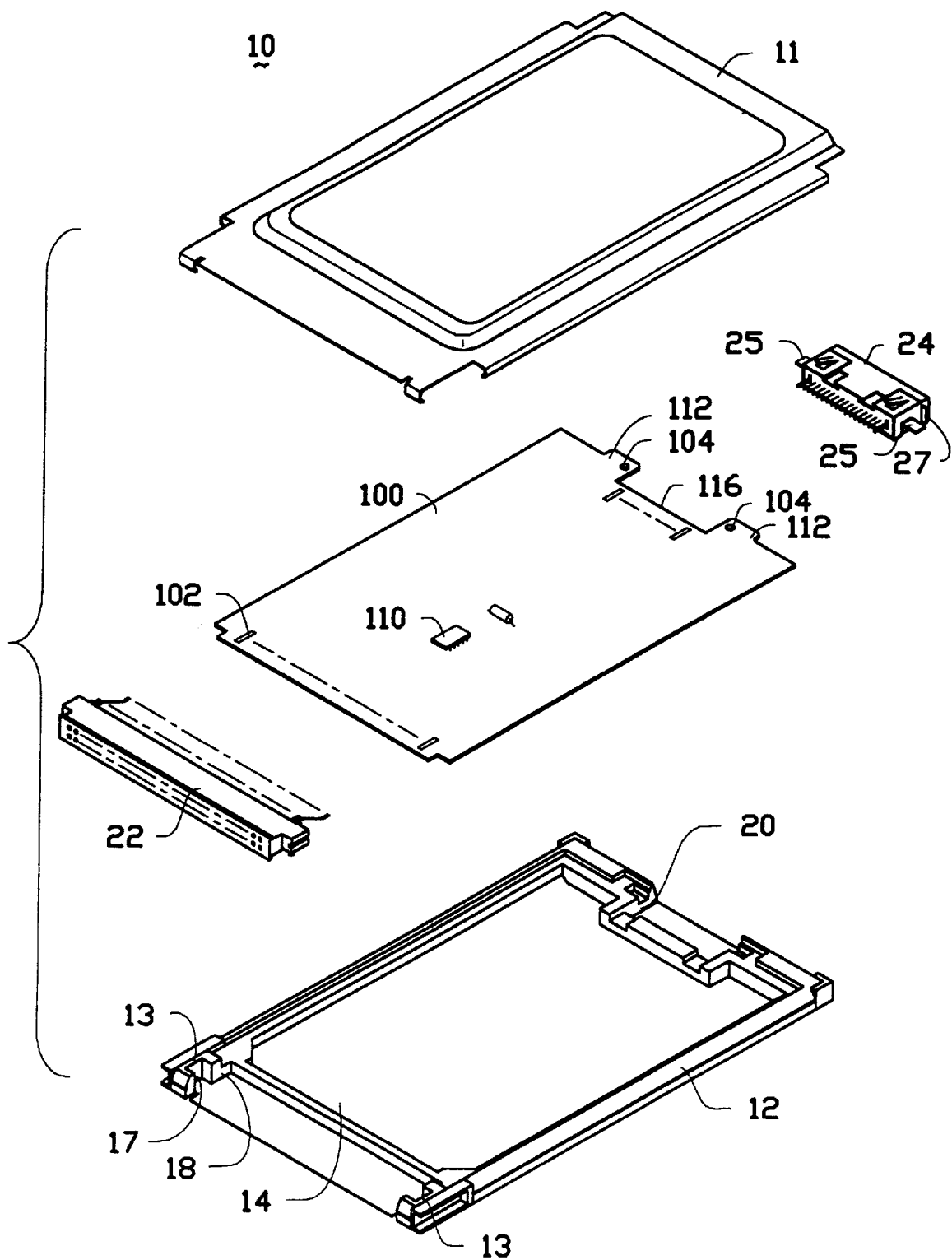
FIG. 1 is an exploded perspective view of an I/O card assembly of a presently preferred embodiment, according to the invention.
Figure 2:
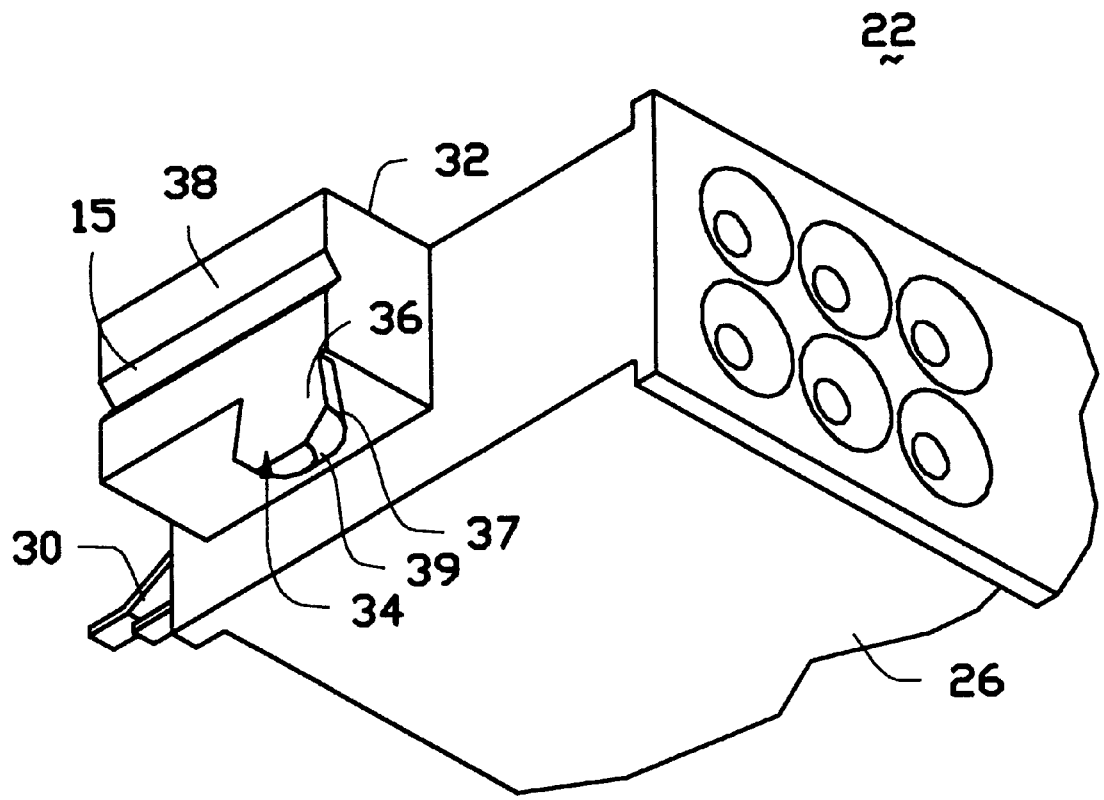
FIG. 2 is a bottom perspective view of the 68 pins connector of the I/O card assembly of FIG. 1.
Figure 3:
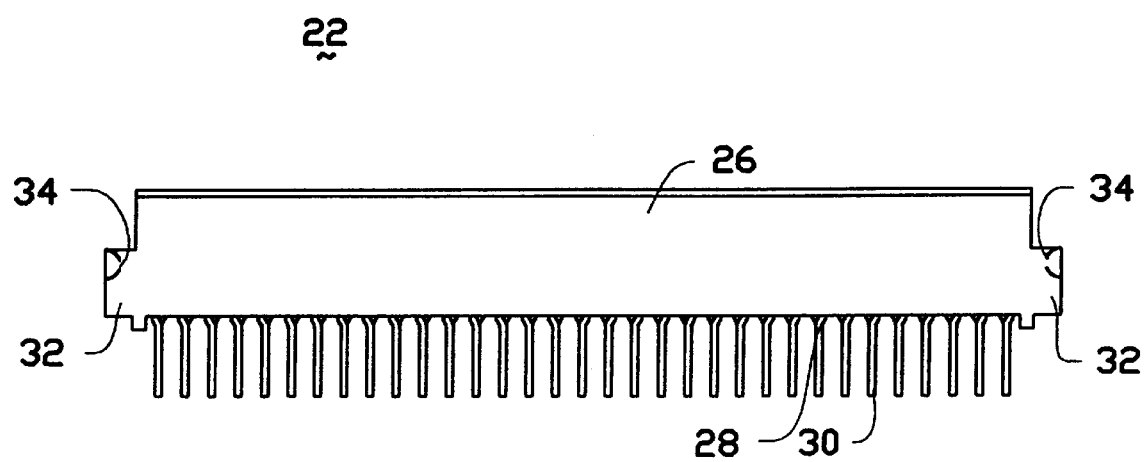
FIG. 3 is a top plan view of the connector of FIG. 2.
Figure 4:
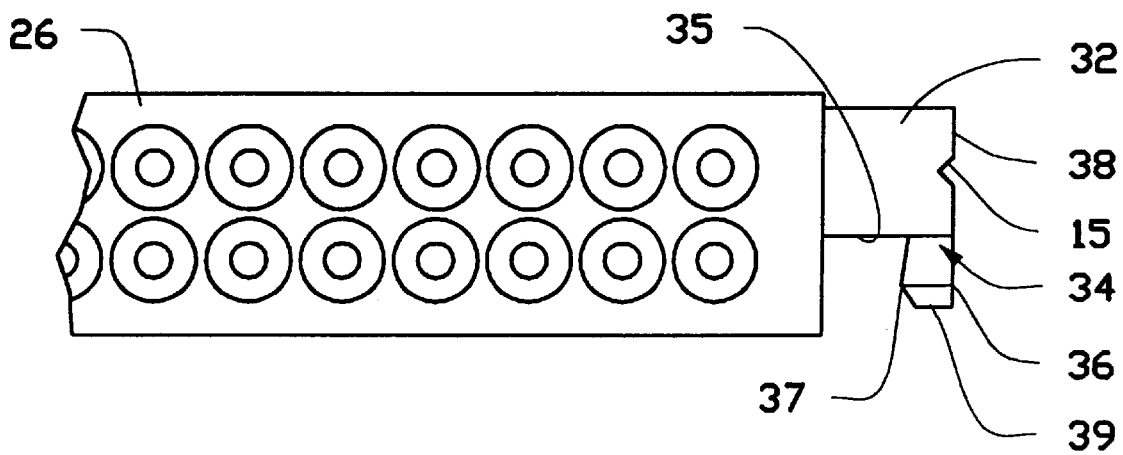
FIG. 4 is a fragmentary front plan view of the connector of FIG. 2 without contact therein to show the post of the mounting ear.
Figure 5:
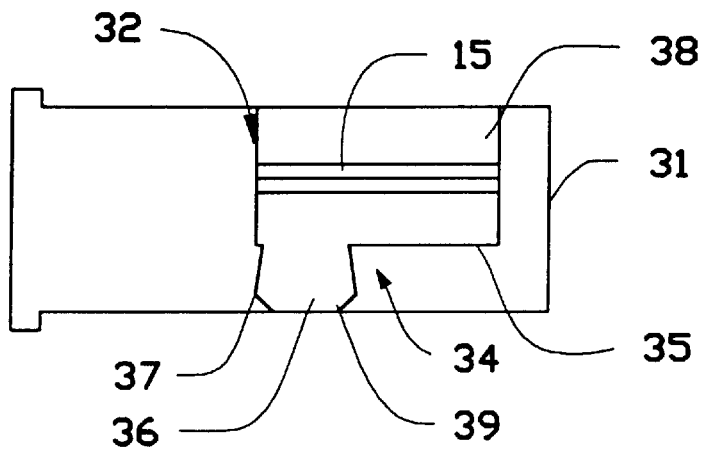
FIG. 5 is a side plan view of the connector of FIG. 2 without contacts therein to show the post of the mounting ear.

It will be noted here that for a better understanding, most of like components are designated by like reference numerals throughout the various figures in the embodiments. Attention is now directed to FIG. 1, wherein an I/O card 10 includes an insulative frame 12 cooperating with a top metal cover 11 and a bottom metal cover 14 to sandwich an internal PC board 100 therein. The frame 12 forms two opposite openings 18, 20 at two opposite ends of the I/O card 10 wherein the large opening 18 is adapted to receive a 68 pins connector 22 therein for engagement with a complementary memory card connector (not shown) built in the computer case, and the small opening 20 is adapted to receive an I/O connector 24 therein for engagement with a complementary cable connector (not shown) which is connected to a periphery like a printer.

Referring to FIGS. 2–5, the 68 pins connector 22 includes an insulative housing 26 having two rows of contacts 28 extending in a front-to-end direction wherein the tails 30 of the contacts 28 are exposed on the rear side of the housing 26 for solderably electrical and mechanical engagement with the circuit pads 102 printed on the PC board 100. The housing 26 includes a pair of mounting ears 32 positioned at two opposite ends in its lengthwise direction for receivably latchable engagement within a pair of opposite recesses 13 in one end of the frame 12 wherein a rib 17 in the recess 13 is received within a notch 15 of the mounting ear 32. Different from the prior art I/O cards, the housing 26 of the invention further includes a pair of retention posts 34 integrally downward from such pair of mounting ears 32, respectively, for incorporating a pair of retention holes 104 in the raw PC board plate 106 (FIG. 6) for temporarily retaining the 68 pins connector 22 with regard to the corresponding PC board 100 on which the tails 30 of the contacts 28 are seated for soldering.

Each post 34 generally is of a half truncated cone wherein a plane 36 is coplanar with the side surface 38 of the mounting ear 32. The post 36 also includes a converged portion 39 at its bottom end for easy insertion into the corresponding hole 104 in the raw PC board plate 106. The post 36 provides a temporary retention for the connector 22 regard to the corresponding PC board 100 before the contact tails 30 have been soldered onto the circuit pads 102 printed on the PC board 100. When the connector 22 is adapted to be solder onto the PC board 100, the housing 26 of the connector 22 is moved toward the edge 108 of the PC board 100, and preferably the rear surface 31 thereof confronts the edge 108 of the PC board 100, and the contact tails 30 may be properly in alignment with and seated on the corresponding circuit pads 102, respectively, for being ready to be soldered. In this situation, two posts 36 can be inserted into the corresponding retention holes 104 in the raw PC board plate 106. Because the distance between the two posts 36 and the distance between the corresponding two holes 104 in the raw PC board plate 106 are designedly arranged to comply with each other, each post 34 can be substantially engaged within the corresponding hole 104 as shown in FIG. 7(A).

Figure 7:
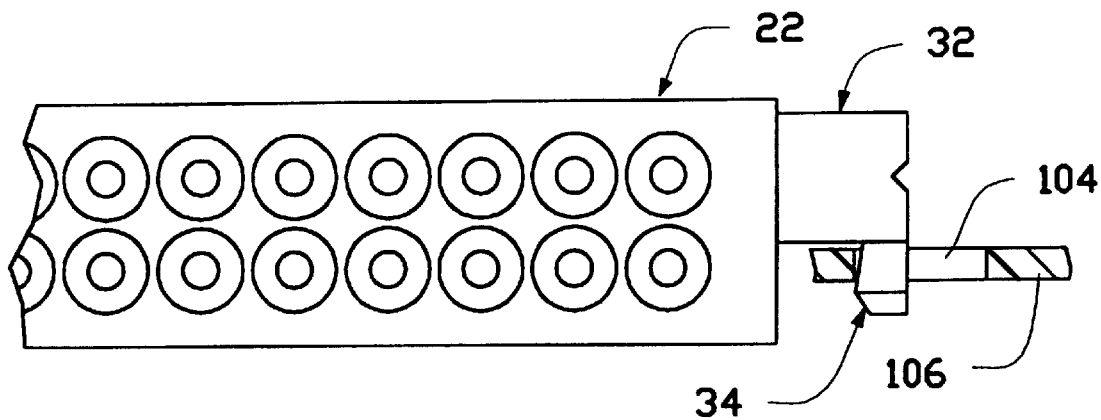
FIG. 7(A) is a partial front plan view of the connector of FIG. 2 with a cut-away raw PC board plate to show the post of the mounting ear incorporates the hole in the plate.
FIG. 7(B) is a partial front plan view of another embodiment of the connector with a cut-away raw PC plate wherein the post of the mounting ear has a sand-glass configuration to have the connector be in a stable orientation with the plate in a vertical direction.
Figure 7:
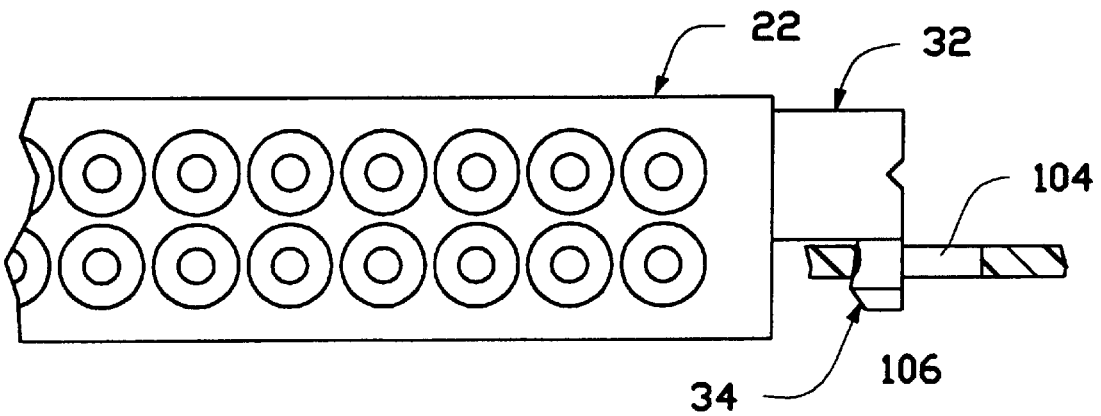

The height of the post 34 is somewhat substantially larger than the thickness of the PC board 100 so that the plate 106 can be designedly arranged to be movably positioned between the bottom surface 35 of the mounting ear 32 and the outermost circumferential edge 37 of the retention post 34, as shown in FIG. 7(A). In other words, the bottom surface 35 of the mounting ear 32 and the outermost circumferential edge 37 of the retention post 34, restrain the movement of the connector 22 in the vertical direction, and the hole 104 restrains the horizontal movement of the post 34, thus the connector 22 being unable to be dropped from or misplaced to such raw PC board plate 106 even under a vibration condition before the contact tails 30 have been permanently soldered onto the circuit pads 102. Therefore, this temporary retention assures the correct positioning of contact tails 30 with regard to the corresponding circuit pads 102 of the PC board 100 when the reflow soldering process occurs. Accordingly, the satisfied connection between the contact tails 30 and the circuit pads 102 are obtained. Understandably, the external shaped of the post 34 may be alternately arranged to be a sand-glass form as shown in FIG. 7(B), whereby the plate 106 may be designedly efficiently retained in a specific vertical position, i.e., being appropriately suspended between and respectively spaced from the bottom surface 35 and the outermost circumferential edge 37 of the retention post 34. The efficient vertical fixation of the connector 22 with regard to the plate 106 is helpful to correctly solder the contact tails 30 on the circuit pads 102.

It is appreciated that the other electrical components 110 and the I/O connector 24 can also be soldered onto the corresponding pads or traces on the board 100 at the same reflow process with the connector 22. It is also noted that the electrical components 110 which are directly surface-mounted on the central region of the board 100, are easy to tack care of because they are of a common surface mount process for the electrical components substantially supported the board area. Differently, either the 68 pins connector 22 or the I/O connector 24, is not substantially and directly mounted on the board 100. Instead, either of them is generally suspended by the edge of the board 100 and only attached to the board 100 through soldering of the contact tails. It results in difficulties of correct soldering of the contact tails of the connector 22, 24 and the corresponding circuit pads 102 of the board 100.

This is the reason why the invention provides a reliable and better retention means for efficiently retainably positioning the 68 pins connector 22 with regard to the raw PC board plate 106 for the later reflow soldering process. In this embodiment, the retention holes 104 are provided on the portion of the raw PC board plate 106 wherein such portion will be discarded after the individual PC board 100 is completed with the associated components 110 and connector 22, 24 thereon. The respective PC boards 100 can be detached from the raw PC board plate 106 by splitting along fours bridge sections 118 between the individual PC board 100 and the remaining portions of the raw PC board plate 106, and this cut-off is of the prior arts.

Figure 6:
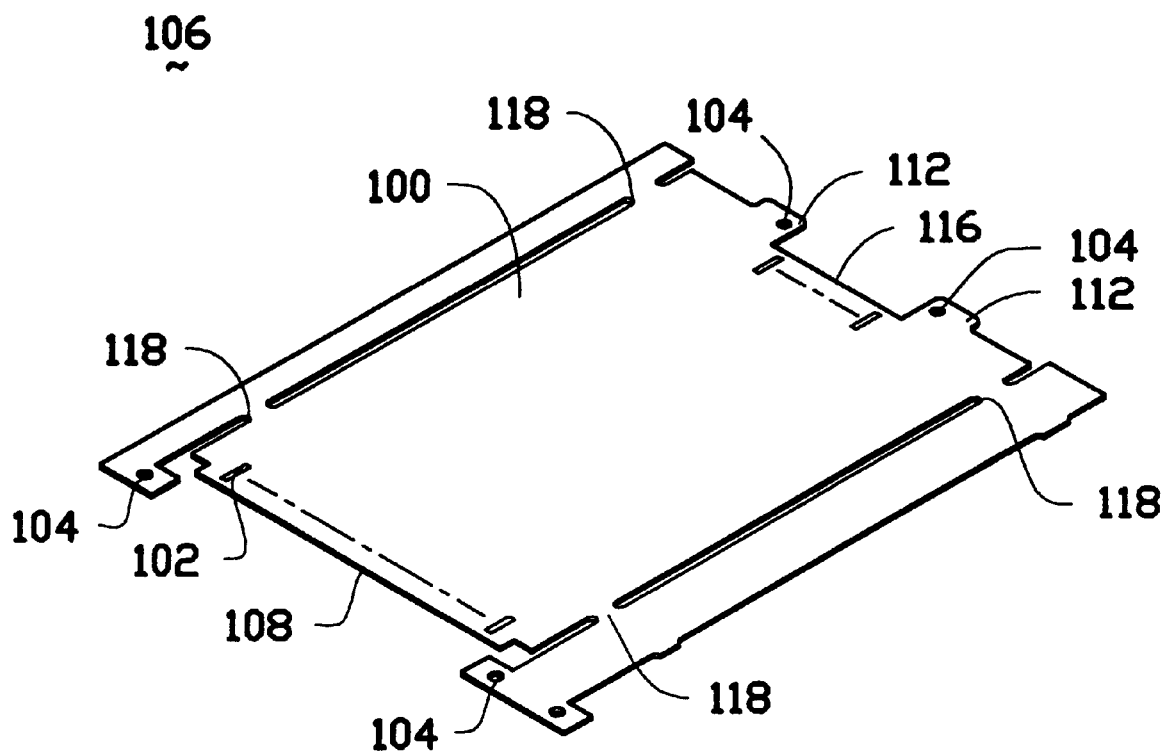
FIG. 6 is a partial perspective view of a raw PC board plate for production of the PC board of FIG. 1.

Alternately, the retention hole 104 can also be positionable in the individual PC board 100 itself. Referring to FIGS. 1 and 6, the I/O connector 24 is adapted to be secured to the other edge 116 of the PC board 100. To provide the efficient supporting and retention means that the I/O connector 24 can be properly hold in position for soldering the contact tails to the corresponding pads on the PC board 100, by following the spirit of the invention used for the 68 pins connector 22, a pair of restraining bars 112 extend outward from the edge 116 of the PC board 100, and each has a retention hole 104 therein. Correspondingly, the I/O connector 24 which already having a pair of mounting ears 25 at two opposite lengthwise ends for sitting on the frame 12, further includes a pair of dimples 27 respectively extending downward from the mounting ear 25. Similar to the 68 pins connector 22, the I/O connector 24 can be slightly retained in position with regard to the raw PC board plate 106 through the mounting ears 25 and their associated dimples 27 incorporating the corresponding retention holes 104 in the restraining bars 112 which are a portion of the PC board 100 itself.

In comparison with the prior arts, by retention means disposed on the connector and on the PC board or the raw plate of the PC board, the invention provides the I/O card with easy and reliable soldering connection between the contact tails of the connector and the PC board.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

I claim:

1. A method for forming an I/O card assembly, comprising the following steps:

preparing a printed circuit board having an inner area and an outer area connected to the inner area by several points, said inner area having a number of electrical components and a number of circuit pads thereon, the outer area defining a hole;

preparing a dielectric frame defining a recess;

mounting the printed circuit board to the frame;

preparing a connector having a dielectric housing, a number of contacts extending in a front-to-end direction, a mounting ear extending outward from a lengthwise end of the housing, and a retention device extending downward from the mounting ear;

mounting the connector to the printed circuit board and the frame by contacting the contacts with the corresponding circuit pads, latchably fitting the mounting ear to the frame defining the recess and extending the retention device through the hole to engage with the outer area of the printed circuit board;

soldering the contacts to the circuit pads of the printed circuit board;

preparing upper and lower metallic covers and respectively mounting the covers to upper and lower sides of the frame to enclose the frame and the inner area of the printed circuit board; and separating the outer area of the printed circuit board from the inner area of the printed circuit board.

2. The method in accordance with claim 1, wherein the retention device is a post having a half truncated cone shape, and wherein the post has a height which is substantially larger than a thickness of the printed circuit board.

3. The method in accordance with claim 2, wherein the post further includes a converged bottom portion to facilitate insertion into the hole.

4. The method in accordance with claim 1, wherein the mounting ear has a notch defined in an end face thereof and the frame has a rib protruding into the recess, and wherein the step to mount the connector to the printed circuit board and the frame causes the rib to engage with the mounting ear defining the notch.

5. A method for forming an intermediate product for an I/O card assembly, comprising the following steps:

preparing a printed circuit board having an inner area and an outer area connected to the inner area by several points, said inner area having a number of electrical components and a number of circuit pads thereon, the outer area defining a hole;

preparing a dielectric frame defining a recess and mounting the printed circuit board to the frame;

preparing a connector having a dielectric housing, a number of contacts extending in a front-to-end direction, a mounting ear extending outward from a lengthwise end of the housing, and a retention device extending downward from the mounting ear; and mounting the connector to the printed circuit board and the frame by contacting the contacts with the corresponding circuit pads, latchably fitting the mounting ear to the frame defining the recess and extending the retention device through the hole to engage with the outer area of the printed circuit board.

6. The method in accordance with claim 5 further comprising a step to solder the contacts to the circuit pads after the step of mounting the connector to the printed circuit board and the frame.

7. The method in accordance with claim 5, wherein the retention device is a post having a half truncated cone shape, and wherein the post has a height which is substantially larger than a thickness of the printed circuit board.

8. The method in accordance with claim 7, wherein the post further includes a converged bottom portion to facilitate insertion into the hole.

9. The method in accordance with claim 5, wherein the mounting ear has a notch defined in an end face thereof and the frame has a rib protruding into the recess, and wherein the step to mount the connector to the printed circuit board and the frame causes the rib to engage with the mounting ear defining the notch.

* * * * *